(12) United States Patent
Kanteti et al.

(10) Patent No.: US 10,784,867 B1
(45) Date of Patent: Sep. 22, 2020

(54) SUPPLY DIFFERENCE CONTROLLED CROSS-COUPLED LEVEL SHIFTING CIRCUIT

(71) Applicant: Texas Instruments Incorporated, Dallas, TX (US)

(72) Inventors: Amar Kanteti, Bangalore (IN); Ajith Kumar Narayanasetty, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/445,915

(22) Filed: Jun. 19, 2019

(30) Foreign Application Priority Data

Apr. 29, 2019 (IN) .............................. 201941016881

(51) Int. Cl.
*H03L 5/00* (2006.01)
*H03K 19/0185* (2006.01)

(52) U.S. Cl.
CPC ........................... *H03K 19/018521* (2013.01)

(58) Field of Classification Search
CPC ..... H03K 19/018521; H03K 3/356113; H03K 19/00315; H03K 17/102; H03K 3/012
USPC .......................... 327/333; 326/36, 68, 80, 81
See application file for complete search history.

(56) References Cited

U.S. PATENT DOCUMENTS

| | | | | |
|---|---|---|---|---|
| 6,040,708 A * | 3/2000 | Blake | ............... | H03K 3/356113 326/33 |
| 6,801,064 B1 * | 10/2004 | Hunt | .................. | H03K 19/0013 326/63 |
| 6,825,692 B1 * | 11/2004 | Chung | ........... | H03K 19/018585 326/68 |
| 10,110,231 B1 | 10/2018 | Graves | | |
| 2003/0011418 A1 * | 1/2003 | Nishimura | ............. | H03K 3/012 327/333 |
| 2004/0085092 A1 * | 5/2004 | Aoki | ...................... | H03K 3/012 326/81 |

* cited by examiner

*Primary Examiner* — Anh Q Tra
(74) *Attorney, Agent, or Firm* — Lawrence J. Bassuk; Charles A. Brill; Frank D. Cimino

(57) ABSTRACT

A level shifting circuit for a voltage level translator includes first and second cross-coupled level shifters, each coupled between an output supply voltage and a lower rail and further coupled to receive first and second input control signals and to provide an output control signal. The second cross-coupled level shifter includes a first PMOS transistor coupled in series with a first NMOS transistor and a second PMOS transistor coupled in series with a second NMOS transistor. When an input supply voltage is less than a VCCI trigger associated with the output supply voltage, only the first and second NMOS transistors are coupled to contribute to the output control signal and when the input supply voltage is equal to or greater than the VCCI trigger, only the first and second PMOS transistors are coupled to contribute to the output control signal.

15 Claims, 8 Drawing Sheets

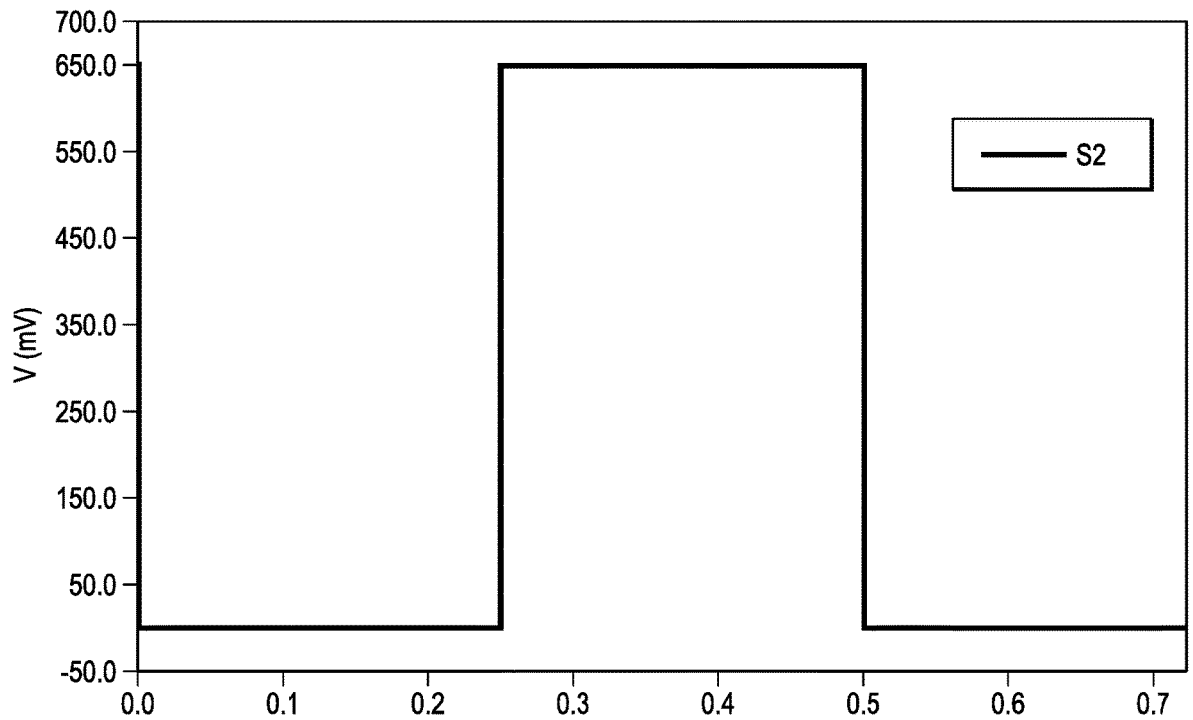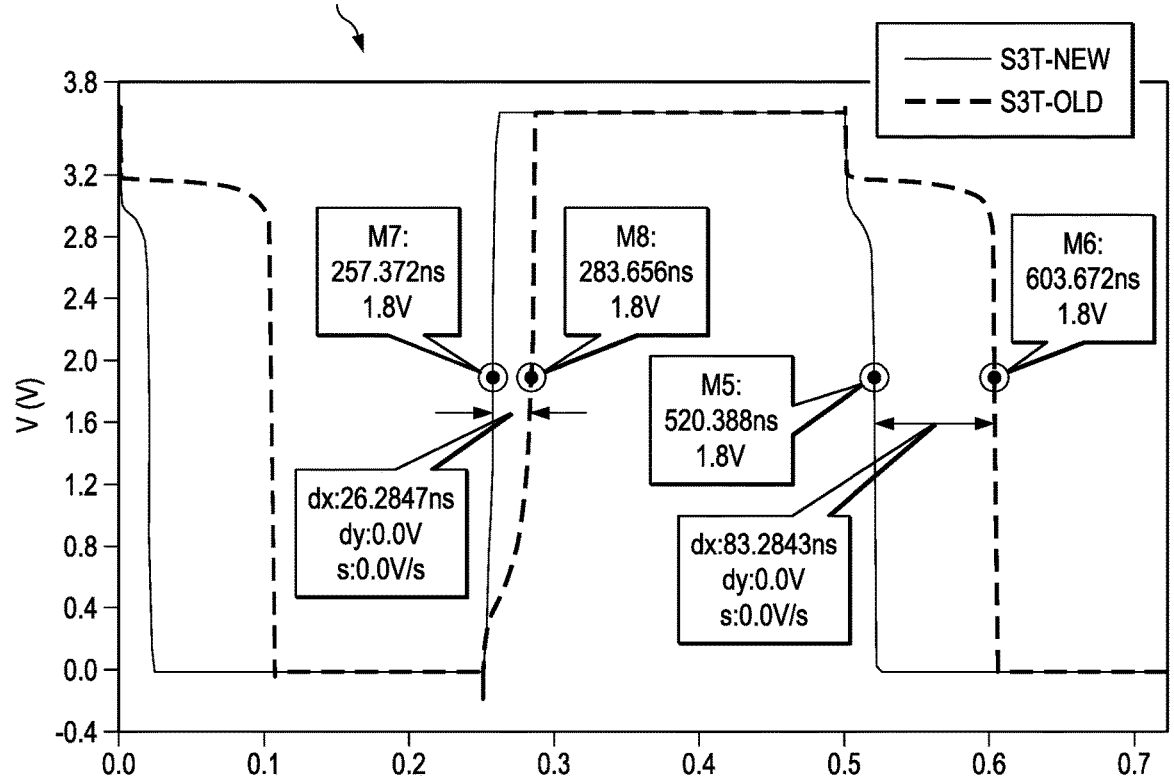

SUPPLY DIFFERENCE CONTROLLED CROSS-COUPLED LEVEL SHIFTING CIRCUIT

CROSS-REFERENCE TO RELATED APPLICATIONS

The present application claims priority to Indian Patent Application No. 201941016881, which was filed Apr. 29, 2019, is titled "SUPPLY DIFFERENCE CONTROLLED HIGH SPEED WIDE VOLTAGE RANGE CROSS COUPLED LEVEL SHIFTER," and which is hereby incorporated by reference in its entirety.

BACKGROUND

As the supply voltage continues to drop for advanced microcontrollers, there is a need to develop low voltage circuits, such as translator products, that will allow these devices to reliably interface with legacy systems. These low voltage level translators, in turn, must be capable of supporting a wide voltage range for maximum application flexibility. Supporting a wide voltage range, e.g., from 0.65 V to 3.6 V, provides numerous challenges.

SUMMARY

Disclosed embodiments provide a level shifting circuit that adjusts the relative sizes of the P-type metal oxide silicon (PMOS) transistors and N-type metal oxide silicon (NMOS) transistors contributing to an output control signal based on the difference between the input supply voltage and the output supply voltage. The disclosed level shifting circuit contains two level-shifters that both contribute to providing an output control signal. A first cross-coupled level shifter is coupled to provide the output control signal with NMOS and PMOS transistors that are sized to address specific concerns. A second cross-coupled level shifter is enabled in a manner that allows either only the PMOS transistors or only the NMOS transistors to contribute to the output control signal. The determination whether the PMOS or the NMOS transistors are enabled to contribute is based on the relationship of an input supply voltage VCCI and a VCCI trigger that is based on the output supply voltage.

In one aspect, an embodiment of a level shifting circuit is disclosed. The level shifting circuit includes a first cross-coupled level shifter coupled between an output supply voltage and a lower rail and further coupled to receive a first input control signal and a second input control signal and to provide an output control signal; and a second cross-coupled level shifter coupled between the output supply voltage and the lower rail and further coupled to receive the first input control signal and the second input control signal and to contribute to the output control signal, the second cross-coupled level shifter comprising a first PMOS transistor coupled in series with a first NMOS transistor between the output supply voltage and a first node and a second PMOS transistor coupled in series with a second NMOS transistor between the output supply voltage and the first node; wherein when an input supply voltage is less than a VCCI trigger associated with the output supply voltage, only the first NMOS transistor and the second NMOS transistor are coupled to contribute to the output control signal and when the input supply voltage is equal to or greater than the VCCI trigger, only the first PMOS transistor and the second PMOS transistor are coupled to contribute to the output control signal.

In another aspect, an embodiment of a voltage level translator chip coupled to translate an input signal received in a first voltage domain to an output signal provided in a second voltage domain, wherein each of the first and second voltage domains can span a wide range of voltages is disclosed. The voltage level translator chip includes an input buffer coupled to receive the input signal and to provide a first input control signal and a second input control signal, the input buffer operating in the first voltage domain; a level shifting circuit coupled to receive the first input control signal and the second input control signal and to provide an output control signal; a gate control circuit coupled to receive the first input control signal, the second input control signal and the output control signal and to provide a first gate control signal and a second gate control signal; and an output buffer coupled to receive the first gate control signal and the second gate control signal and to provide the output signal, wherein the level shifting circuit, the gate control circuit and the output buffer each operate in the second voltage domain; further wherein the level shifting circuit comprises: a first cross-coupled level shifter coupled between an output supply voltage and a lower rail and further coupled to receive the first control signal and the second control signal and to provide the output control signal; and a second cross-coupled level shifter coupled between the output supply voltage and the lower rail and further coupled to receive the first control signal and the second control signal and to contribute to the output control signal, the second cross-coupled level shifter comprising a first PMOS transistor coupled in series with a first NMOS transistor and a second PMOS transistor coupled in series with a second NMOS transistor, the second cross-coupled level shifter being coupled such that when an input supply voltage is less than a VCCI trigger associated with the output supply voltage only the first NMOS transistor and the second NMOS transistor contribute to the output control signal and when the input supply voltage is equal to or greater than the VCCI trigger only the first PMOS transistor and the second PMOS transistor contribute to the output control signal.

In yet another aspect, an embodiment of a method of operating a voltage level translator chip is disclosed. The method includes providing a voltage level translator embodied on an IC chip, a level shifting circuit of the voltage level translator comprising a first cross-coupled level shifter that is coupled to provide an output control signal and a second cross-coupled level shifter that is coupled to contribute to the output control signal, the second cross-coupled level shifter being coupled such that when an input supply voltage is less than a VCCI trigger associated with an output supply voltage, only NMOS transistors in the second cross-coupled level shifter are enabled and when the input supply voltage is equal to or greater than the VCCI trigger, only PMOS transistors in the second cross-coupled level shifter are enabled; coupling the input supply voltage for a first voltage domain to a first voltage supply pin of the IC chip; coupling the output supply voltage for a second voltage domain to a second voltage supply pin of the IC chip; coupling a first data pin for the first channel to receive a first signal that operates in the first voltage domain; and coupling a second data pin for the first channel to provide a translated first signal that operates in the second voltage domain.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 2A and 2B depict improvements in propagation delay provided by the level shifting circuit of FIG. 1 at two supply voltage combinations according to an embodiment of the disclosure;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 4:
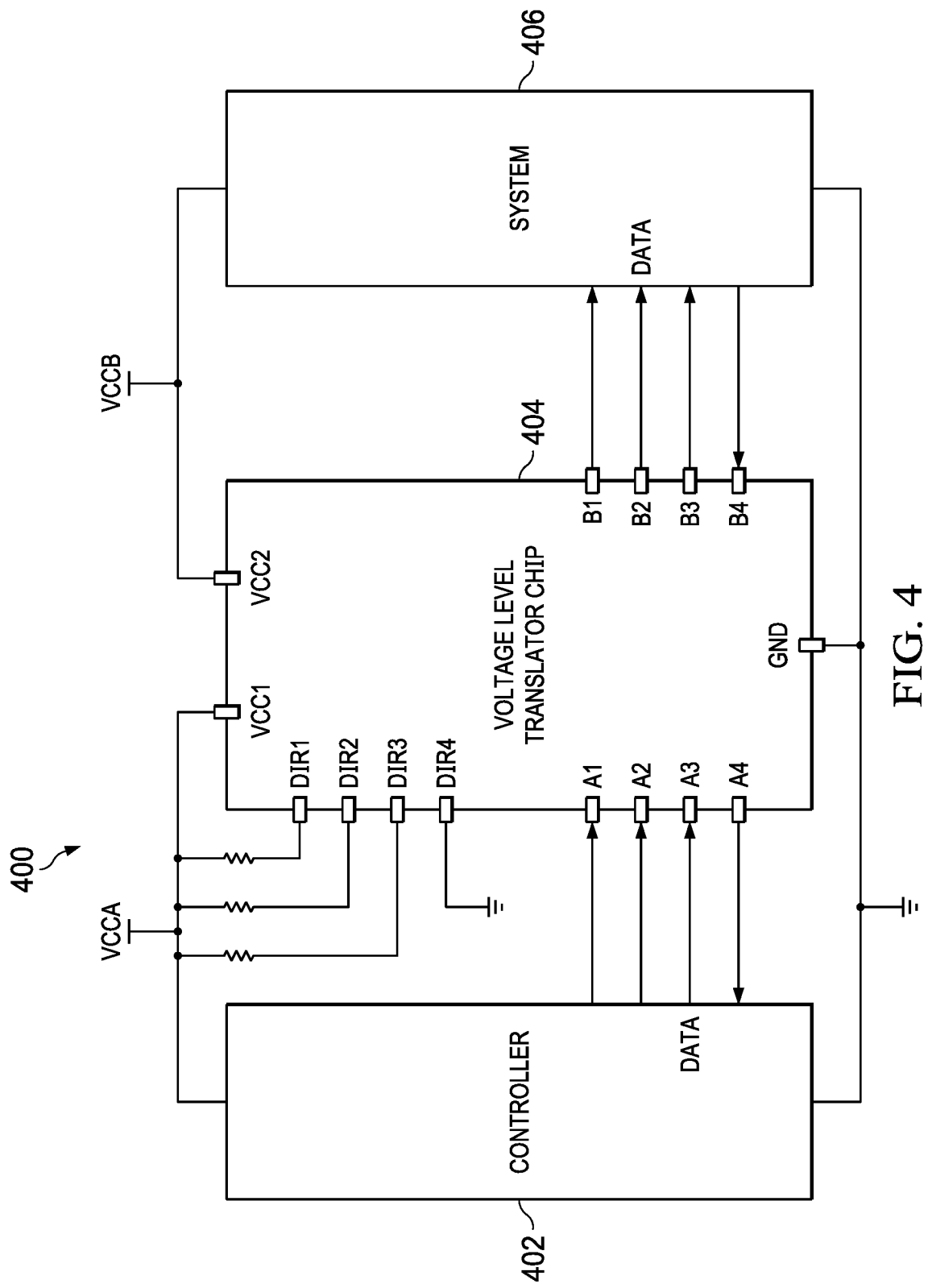
FIG. 4 illustrates a system in which an embodiment according to the disclosure can be utilized.

FIG. 4 depicts a system 400 in which a bidirectional voltage level translator chip 404 is coupled to translate the voltage level of signals passed between a controller 402 and system 406. A first voltage supply pin VCC1 is for coupling to a first voltage domain, which uses a first supply voltage VCCA that is used by controller 402; a second voltage supply pin VCC2 is for coupling to a second voltage domain, which uses a second supply voltage VCCB that is used by system 406; and a third voltage supply pin GND is for coupling to a third supply voltage, which may be a ground plane, in order to provide a lower rail. In the embodiment shown, bidirectional voltage level translator chip 404 has four channels for translation, although bidirectional voltage level translator chip 404 can also have eight, sixteen or any number of channels. Data pin A1 and data pin B1 are coupled to a first channel; data pin A2 and data pin B2 are coupled to a second channel; data pin A3 and data pin B3 are coupled to a third channel; and data pin A4 and data pin B4 are coupled to a fourth channel.

In this embodiment, a first direction pin DIR1, second direction pin DIR2, third direction pin DIR3 and fourth direction pin DIR4 are each coupled to indicate the direction of information flow on a respective channel. In other embodiments, a direction pin can be associated with a group of two or more channels. Coupling any one of the direction pins to first supply voltage VCCA indicates that the flow of information on a respective channel or group of channels is from the first voltage domain to the second voltage domain, while coupling any one of the direction pins to the third supply voltage, e.g., the lower rail, indicates that the flow of information on a respective channel or group of channels is from the second voltage domain to the first voltage domain. In the embodiment shown, the first channel with data pin A1 and data pin B1, the second channel with data pin A2 and data pin B2 and the third channel with data pin A3 and data pin B3 are coupled to handle data flowing from the first voltage domain to the second voltage domain while the fourth channel with data pin A4 and data pin B4 handles information flowing from the second voltage domain to the first voltage domain.

As semiconductor devices have steadily shrunk, the voltages at which the semiconductor devices operate have grown lower. It follows from this observation that the voltages at which controller 402 and system 406 operate can depend on when the chips were created. Given the current state of the art, first supply voltage VCCA and second supply voltage VCCB can vary by an order of magnitude. For example, one of controller 402 and system 406 may use a voltage of 3.6V while the other uses a voltage of 0.65V. Providing the capability of translating signals between these two extremes, as well as the intermediate voltages, provides numerous challenges to circuit design.

Figure 5:
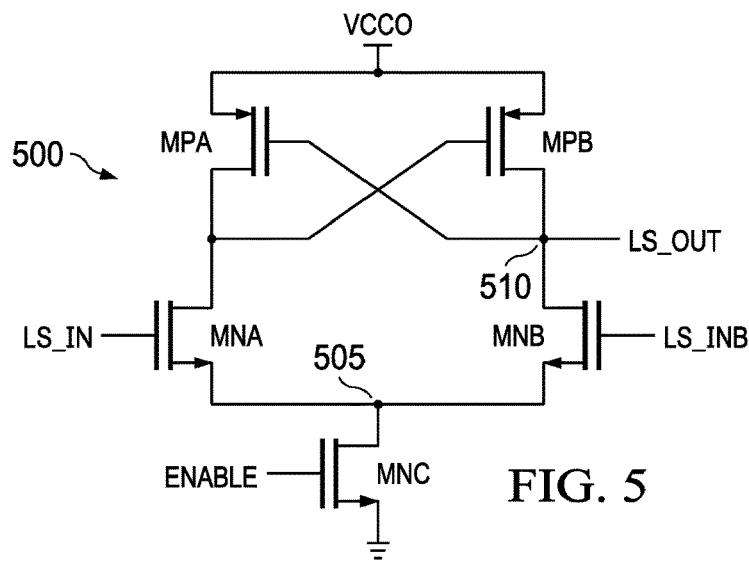
FIG. 5 depicts a conventional cross coupled level shifter that is used for translating between wide voltage ranges.

FIG. 5 depicts a conventional cross-coupled level shifter 500 that can be used to translate across the wide voltage range. In cross-coupled level shifter 500, a first pullup transistor MPA is coupled in series with a first pulldown transistor MNA between an output supply voltage VCCO operating in the output voltage domain and a node 505 and a second pullup transistor MPB is coupled in series with a second pulldown transistor MNB between the output supply voltage and node 505. The gate of pullup transistor MPB is coupled to a point between pullup transistor MPA and pulldown transistor MNA and the gate of pullup transistor MPA is coupled to a node 510 between pullup transistor MPB and pulldown transistor MNB. The gate of pulldown transistor MNA receives a control signal LS_IN and the gate of pulldown transistor MNB receives a control signal LS_INB. As will be seen below, control signal LS_IN and LS_INB are complementary signals that are created in the input buffer. The output signal LS_OUT from the cross-coupled level shifter 500 is taken from the node 510. Additionally, an NMOS transistor MNC is coupled between node 505 and the lower rail and receives an enable signal ENABLE on the gate; NMOS transistor MNC is utilized to disable the level shifter when the associated circuit is inactive, as explained below.

Problems with the architecture of FIG. 5 include propagation delay that increases as the supply voltage difference becomes larger. This increased propagation delay is due to the contention between pulldown NMOS transistors MNA, MNB and pullup PMOS transistors MPA, MPB. Further, if one fixes the propagation delay for certain voltage difference combinations, the propagation delay for other voltage difference combinations will be affected.

For example, to get less propagation delay, a high ratio of NMOS size to PMOS size is necessary when the input supply voltage VCCI is 0.65 V and the output supply voltage VCCO is 3.6 V and a low ratio of NMOS size to PMOS size is necessary when input supply voltage VCCI is 3.6 V and output supply voltage VCCO is 0.65 V. If adjustments are made to optimize propagation delay for the translation from low supply voltage to high supply voltage, the propagation delay for translation from high supply voltage to low supply voltage is worsened.

Figure 6:
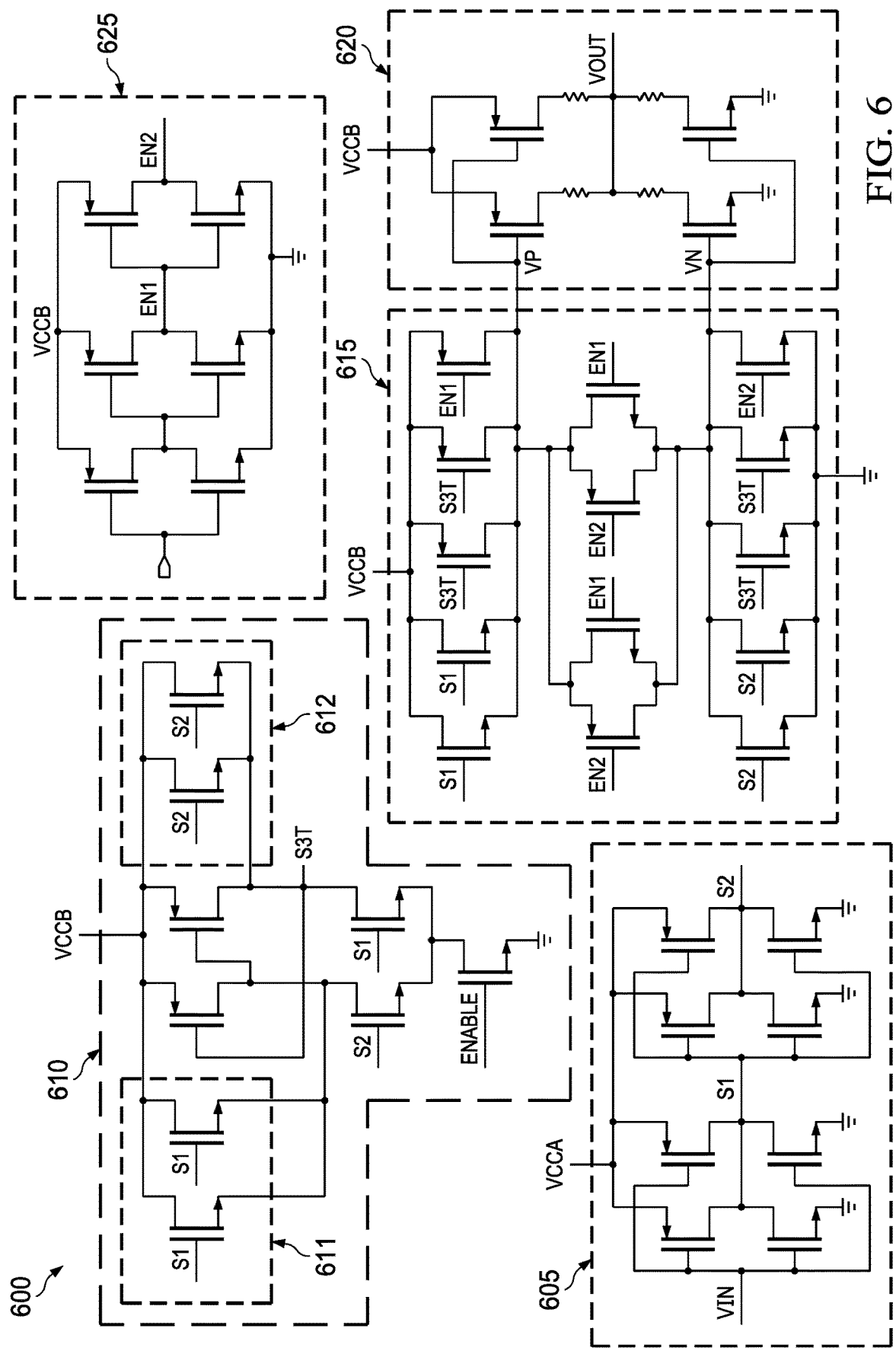
FIG. 6 depicts an example of the circuits in one channel of a voltage level translator into which an embodiment of the disclosure can be incorporated.

FIG. 6 depicts half of an example bidirectional voltage level translator channel 600 for translating a signal between the A voltage domain and the B voltage domain and is derived from U.S. Pat. No. 10,110,231, issued Oct. 23, 2018 in the name of Christopher Michael Graves, which is incorporated by reference herein in its entirety. The circuit shown in FIG. 6 translates a signal from the A voltage domain to the B voltage domain, while an identical circuit (not specifically shown) is coupled to translate a signal from the B voltage domain to the A voltage domain. Only one of these two circuits that make up voltage level translator channel 600 is active at a time while the output buffer of the inactive circuit is placed in a high impedance mode; the directionality of the conversion is determined by the voltage coupling of the corresponding direction pin as explained with reference to FIG. 4.

The following description provides a quick overview of the circuits of FIG. 6; further details can be found in the patent noted above. Voltage level translator channel 600 includes an input buffer circuit 605, a voltage translator circuit 610, gate control circuit 615, output buffer circuit 620 and enable/disable control circuit 625. Input buffer circuit 605 receives an input signal VIN, produces first input control signal S1 and second input control signal S2, and is the only one of the circuits that is powered by first supply voltage VCCA, which is in the "A" voltage domain. First and second input control signals S1 and S2 are used to drive the transistors in voltage translator circuit 610 in order to provide output control signal S3T, which is now operating in the "B" voltage domain. In gate control circuit 615, first and second input control signals S1, S2 and output control signal S3T are all utilized to drive transistors in this circuit to produce gate control signals VP, VN that are passed to output buffer circuit 620. Gate control signals VP and VN control the gates of the output transistors used to provide output signal VOUT. Enable/disable control circuit 625 provides enable signals EN1, EN2, which ensure that gate control signals VP and VN can place the output buffer circuit in high impedance state when necessary.

Because of the difficulties inherent in providing voltage translation across a wide voltage range, voltage level translator channel 600 is designed to provide a parallel threshold voltage (Vt) architecture in which low Vt transistors are coupled in parallel with standard Vt transistors. Although not specifically labeled as such in FIG. 6, examples of low Vt transistors coupled in parallel with standard Vt transistors can be seen in each of input buffer circuit 605, voltage translator circuit 610, gate control circuit 615 and output buffer circuit 620, where two transistors coupled in parallel are both controlled by any one of input signal VIN, first input control signal S1, second control signal S2, output control signal S3T, gate control signal VP or gate control signal VN.

The voltages that are coupled to a particular circuit for translation determines whether the standard Vt or the low Vt transistors contribute most to the conversion. For example, when a voltage of 0.65V is used for the supply voltage of a circuit, standard Vt transistors will generally not turn on and the low Vt transistors predominate. When a voltage of 3.6V is used for the supply voltage of a circuit, the low Vt transistors cannot pass enough current to provide the necessary output voltages, so the standard Vt transistors predominate in this situation.

Within voltage translator circuit 610, two sets of NMOS transistors 611, 612 are circled. These two sets of NMOS transistors 611, 612 are pullup helpers that contribute most to pulling up the output control signal for the high supply voltage to low supply voltage translations and will be discussed in greater detail in reference to FIG. 1. The use of pullup helpers 611, 612 solves the problem of propagation delay for the extreme differences in input and output supply voltages. However, when the sizes of the NMOS transistors are chosen to improve the propagation delay for an input supply voltage VCCI of 0.65 V and an output supply voltage VCCO of 3.6 V, the propagation delay for an input supply voltage VCCO of 1.8 V and an output supply voltage VCCO of 3.6 V increases. Similarly, when the sizes of the NMOS transistors are chosen to fix the propagation delay for an input supply voltage VCCI equal to 1.8 V and an output supply voltage VCCO of 3.6 V, the propagation delay for the input supply voltage VCCI equal to 0.65 V and the output supply voltage VCCO equal to 3.6 V will increase. The disclosed level shifting circuit addresses this issue.

Figure 1:
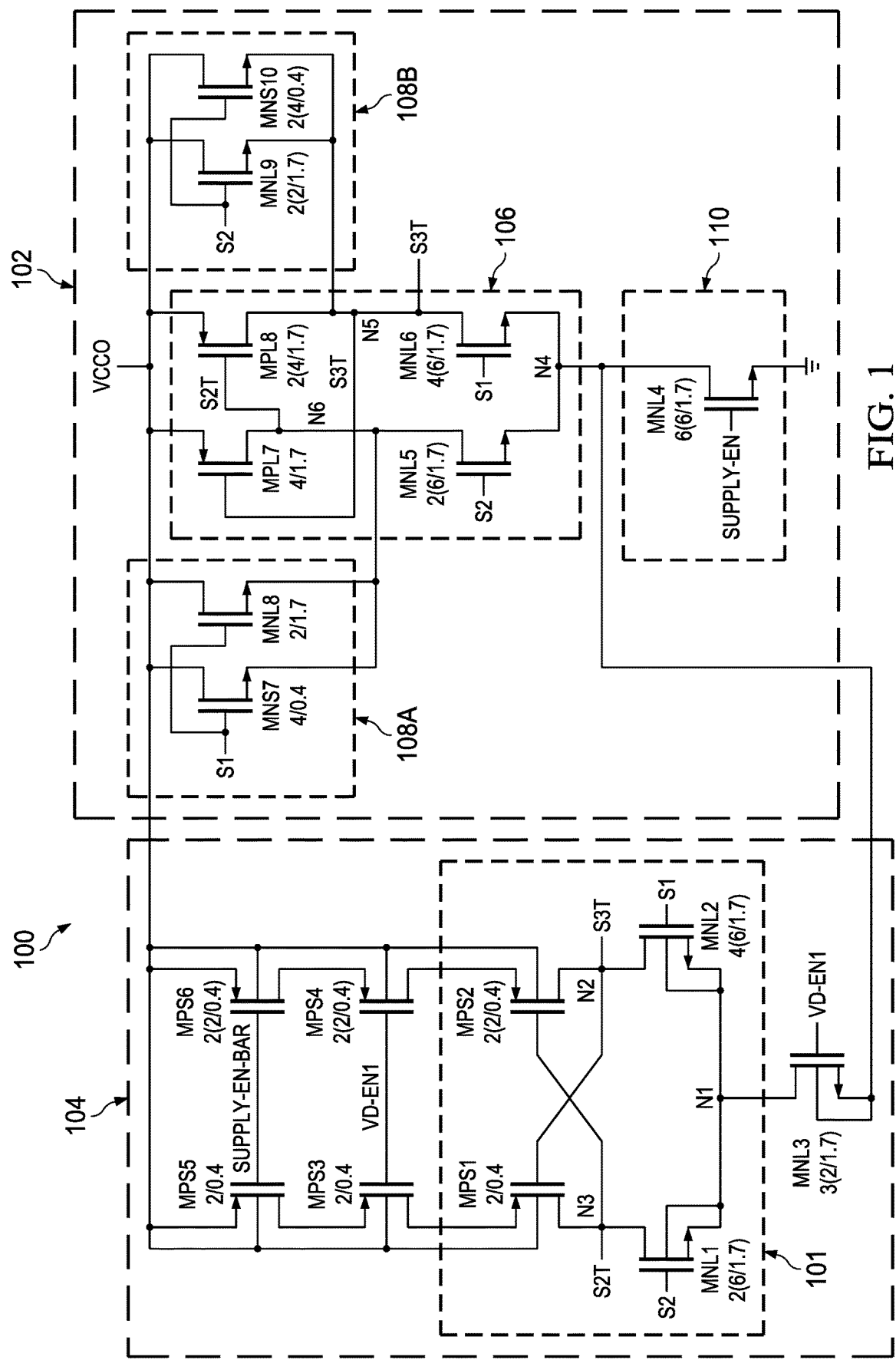
FIG. 1 depicts an implementation of a level shifting circuit that includes two cross-coupled level shifters according to an embodiment of the disclosure.

FIG. 1 depicts a level shifting circuit 100 for a voltage level translator, such as the voltage level translator channel 600. In one embodiment, level shifting circuit 100 includes a first cross-coupled level shifter 102 and a second cross-coupled level shifter 104. The sizes of PMOS and NMOS transistor in first cross-coupled level shifter 102 are selected to provide a base level for output control signal S3T. Second cross-coupled level shifter 104 is coupled such that either only the PMOS transistors or else only the NMOS transistors in second cross-coupled level shifter 104 are active for any specific input supply voltage and output supply voltage combination. A supply difference sensing circuit 100A is described below in FIG. 1A. A VCCI trigger is determined by supply difference sensing circuit 100A based on the output supply voltage VCCO for the channel. If the input supply voltage VCCI is less than the VCCI trigger, then the NMOS transistors are enabled; while if the input supply voltage is equal to or greater than the VCCI trigger, then the PMOS transistors are enabled. By allowing only the PMOS transistors or else only the NMOS transistors in second cross-coupled level shifter 104 to contribute to the output control signal S3T, the effective relationship in size between the NMOS transistors and the PMOS transistors in level shifting circuit 100 can be automatically changed by detecting the relationship between the input supply voltage and the output supply voltage.

Each of first cross-coupled level shifter 102 and second cross-coupled level shifter 104 is coupled to receive the first input control signal S1 and the second input control signal S2 that are provided by an input buffer for the respective voltage level translator channel and are each further coupled to contribute to output control signal S3T. As noted above, first cross-coupled level shifter 102 provides a base level for output control signal S3T and second cross-coupled level shifter 104 adjusts the relationship between the sizes of the NMOS and PMOS transistors depending on the values of the input supply voltage and the output supply voltage. One embodiment of the disclosed level shifting circuit will now be discussed, although this embodiment is provided as an example and is not intended to be limiting.

In the discussion that follows, it will be noted that the transistors are numbered according to the following notation. For a transistor MXYZ, X has a value of either N or P and indicates whether the transistor is NMOS or PMOS; Y has a value of either S or L and indicates whether the transistors has a standard threshold voltage or a low threshold voltage; and Z has a numerical value, the numerical value being a unique identifier within the PMOS transistors or within the NMOS transistors of this disclosure. The disclosed embodiments were formed using proprietary processes that set a standard Vt at 700 mV and a low Vt at 300 mV. However, the disclosed embodiments are not limited by this proprietary process and other values of standard and low threshold voltages can also be utilized.

In addition to the transistor numbering, the sizes of each of the transistors for the disclosed embodiment is noted in the figure as F*(W/L), where W is the width of the transistor, L is the length and F, if present, indicates the number of fingers of the transistor that have these dimensions. Finally, it can be noted that the upper rail for the level shifting circuit 100 is the output supply voltage VCCO.

In the embodiment shown, the second cross-coupled level shifter 104 includes a first PMOS transistor MPS1 coupled in series with a first NMOS transistor MNL1 between the output supply voltage VCCO and a first node N1. Second cross-coupled level shifter 104 also includes a second PMOS transistor MPS2 coupled in series with a second NMOS transistor MNL2 between the output supply voltage VCCO and the first node N1. The gate of first PMOS transistor MPS1 is coupled to a second node N2 that lies between the second PMOS transistor MPS2 and the second NMOS transistor MNL2 and the gate of second PMOS transistor MPS2 is coupled to a third node N3 that lies between the first PMOS transistor MPS1 and the first NMOS transistor MNL1. These four transistors, i.e., first PMOS transistor MPS1, second PMOS transistor MPS2, first NMOS transistor MNL1 and second NMOS transistor MNL2, form the core 101 of second cross-coupled level shifter 104, while the remaining transistors in second cross-coupled level shifter 104 serve to couple or decouple the core 101 from one or both of output supply voltage VCCO and the lower rail.

Second cross-coupled level shifter 104 also includes third PMOS transistor MPS3 and fourth PMOS transistor MPS4, which each receive a first voltage-difference-enable signal VD-EN1 on a respective gate, fifth PMOS transistor MPS5 and sixth PMOS transistor MPS6, which each receive a first circuit-enable signal supply-EN-BAR on a respective gate, third NMOS transistor MNL3, which receives the first voltage-difference-enable signal VD-EN1 on a respective gate, and fourth NMOS transistor MNL4, which receives a second circuit-enable signal supply-EN on a respective gate. Fifth PMOS transistor MPS5 is coupled in series with third PMOS transistor MPS3 between the output supply voltage and first PMOS transistor MPS1. Similarly, sixth PMOS transistor MPS6 is coupled in series with fourth PMOS transistor MPS4 between the output supply voltage and second PMOS transistor MPS2. Third NMOS transistor MNL3 is coupled in series with fourth NMOS transistor MNL4 between the first node N1 and the lower rail.

The first voltage-difference-enable signal VD-EN1 is used to determine whether the PMOS transistors or the NMOS transistors in core 101 will contribute to the output control signal S3T. When first voltage-difference-enable signal VD-EN1 is high, third PMOS transistor MPS3 and fourth PMOS transistor MPS4 are each turned off, decoupling first PMOS transistor MPS1 and second PMOS transistor MPS2 from output supply voltage VCCO, so that the PMOS transistors are unable to pull up output control signal S3T. At the same time, third NMOS transistor MNL3 is turned on, so that first NMOS transistor MNL1 and second NMOS transistor MNL2 are coupled to the lower rail and are able to pull down output control signal S3T.

When first voltage-difference-enable signal VD-EN1 is low, the opposite is true and third PMOS transistor MPS3 and fourth PMOS transistor MPS4 are each turned on, coupling first PMOS transistor MPS1 and second PMOS transistor MPS2 to output supply voltage VCCO, so that the PMOS transistors are able to pull up output control signal S3T, while third NMOS transistor MNL3 is turned off, so that first NMOS transistor MNL1 and second NMOS transistor MNL2 are decoupled from the lower rail and are unable to pull down output control signal S3T.

Additionally, first circuit-enable signal supply-EN-BAR and second circuit-enable signal supply-EN always have opposite values. When first circuit-enable signal supply-EN-BAR is high and second circuit-enable signal supply-EN is low, second cross-coupled level shifter 104 is decoupled from both output supply voltage VCCO and the lower rail and is thus inactive. Because fourth NMOS transistor MNL4 is shared with first cross-coupled level shifter 102, first cross-coupled level shifter 102 is also inactive in this situation. For normal operation of level shifting circuit 100, first circuit-enable signal supply-EN-BAR is low and second circuit-enable signal supply-EN is high.

In the embodiment shown, first cross-coupled level shifter 102 includes low Vt level shifter 106, a first pull-up circuit 108A, a second pull-up circuit 108B, and a disable switch 110. In low Vt level shifter 106, each of the transistors is implemented as low Vt transistors. Seventh PMOS transistor MPL7 is coupled in series with fifth NMOS transistor MNL5 between output supply voltage VCCO and a fourth node N4 and eighth PMOS transistor MPL8 is coupled in series with sixth NMOS transistor MNL6 between output supply voltage VCCO and the fourth node N4. The gate of seventh PMOS transistors MPL7 is coupled to a fifth node N5 between eighth PMOS transistor MPL8 and sixth NMOS transistor MNL6 and the gate of eighth PMOS transistor MPL8 is coupled to a sixth node N6 between seventh PMOS transistor MPL7 and fifth NMOS transistor MNL5. The gate of fifth NMOS transistor MNL5 is controlled by second input control signal S2 and the gate of sixth NMOS transistor MNL6 is controlled by first input control signal S1. Because both of input control signals S1 and S2 are created in the input voltage domain, fifth NMOS transistor MNL5 and sixth NMOS transistor MNL6 are controlled by signals created in the input voltage domain, while seventh PMOS transistor MPL7 and eighth PMOS transistor MPL8 are controlled by signals in the output voltage domain. Notably, only low VT transistors are used for switching capability over the full voltage range from 0.65V to 3.6V on either supply. The width of low VT transistors is minimized to keep the leakage current as low as possible.

First pull-up circuit 108A includes seventh NMOS transistor MNS7 and eighth NMOS transistor MNL8, which are each coupled in parallel with seventh PMOS transistor MPL7 between output supply voltage VCCO and sixth node N6. The gates of seventh NMOS transistor MNS7 and eighth NMOS transistor MNL8 are controlled by first input control signal S1.

Second pull-up circuit 108B includes ninth NMOS transistor MNL9 and tenth NMOS transistor MNS10, which are each coupled in parallel with eighth PMOS transistor MPL8 between output supply voltage VCCO and fifth node N5 and have their gates controlled by input control signal S2. Output control signal S3T is taken from fifth node N5. The size of each of seventh NMOS transistor MNS7, eighth NMOS transistor MNL8, ninth NMOS transistor MNL9, and tenth NMOS transistor MNS10 is small compared to the size of fifth NMOS transistor MNL5 and sixth NMOS transistor MNL6. In one embodiment where first cross-coupled level shifter 102 acts without assistance to provide level shifting for a channel, e.g., voltage translator circuit 610 as shown in FIG. 6, seventh NMOS transistor MNS7, eighth NMOS transistor MNL8, ninth NMOS transistor MNL9, and tenth NMOS transistor MNS10 have respective widths that are one-fifth to one-fourth the width of fifth NMOS transistor MNL5 and sixth NMOS transistor MNL6.

Because the NMOS transistors are driven by the input control signals S1, S2 that operate in the input voltage domain, while the PMOS transistors are driven by output control signals S2T, S3T that operate in the output voltage domain, the effectiveness of the pull-up circuits 108 scales with the input and output voltage levels. That is, when the voltage of input supply voltage VCCI is low, first pull-up circuit 108A and second pull-up circuit 108B will only be weakly turned on. However, since the response of fifth NMOS transistor MNL5 and sixth NMOS transistor MNL6 is weak in this same situation, a strong response from pull-up circuits 108 is not desired. When the voltage on input supply voltage VCCI is set to be higher and the effect of the skewed sizes of seventh PMOS transistor MPL7 and eighth PMOS transistor MPL8 is more evident, the effect of pull-up circuits 108 is stronger and continues to scale upward as input supply voltage VCCI is set to higher values.

The pull-up circuits 108 help improve the switching time and data rate. A final element of first cross-coupled level shifter 102 is a disable switch 110, which in the disclosed embodiment contains the fourth NMOS transistor MNL4 that is shared with second cross-coupled level shifter 104. Disable switch 110 is provided to reduce the dynamic current of the full bitcell by blocking the current path of non-switching half bit level shifter. That is, when the output buffer to which the level shifter is coupled is placed in high-impedance mode, the disable switch 110 will turn OFF to keep the level shifting circuit 100 from switching based on the input state. Although not implemented in parallel architecture in the embodiment shown, disable switch 110 could also be implemented in parallel in other embodiments. The width of the fourth NMOS transistor MNL4 is minimized to keep the leakage current as low as possible.

In the presently disclosed embodiment, when first cross-coupled level shifter 102 operates in combination with second cross-coupled level shifter 104, the sizes of the transistors can be determined in conjunction with determining the sizes of the transistors in second cross-coupled level shifter 104, so that the overall circuit can be optimized to two separate ratios of NMOS:PMOS sizes. An example of the transistor sizes utilized in one embodiment is discussed below, but can be adjusted as desired to fit differing circumstances.

In the embodiment shown in FIG. 1, PMOS transistors MPL7, MPL8 in first cross-coupled level shifter 102 have respective sizes of 4/1.7 and 2(4/1.7) and NMOS transistors MNL5, MNL6 have respective sizes of 2(6/1.7) and 4(6/1.7), so that the ratio of the widths of NMOS:PMOS in low Vt level shifter 106 is about 36:12 or 3:1. The NMOS transistors MNS7, MNL8, MNL9 and MNS10 have respective sizes of 4/0.4, 2/1.7, 2(2/1.7), and 2(4/0.4).

Looking at the second cross-coupled level shifter 104, the PMOS transistors MPS1, MPS2 have respective sizes of 2/0.4 and 2(2/0.4), and the NMOS transistors MNL1, MNL2 have respective sizes of 2(6/1.7) and 4(6/1.7). Because at any given supply voltage difference, either only the PMOS transistors or else only the NMOS transistors are operating, the ratio of the widths of PMOS:NMOS within second cross-coupled level shifter 104 is less important, while the real importance is the way that the sizes of the two types of transistors contributes to the overall ratio of widths of PMOS:NMOS in the level shifting circuit 100. When only the NMOS transistors MNL1, MNL2 are contributing to output control signal S3T, the NMOS:PMOS ratio becomes about 72:12 or 6:1. When only the PMOS transistors MPS1, MPS2 are contributing to output control signal S3T, the NMOS:PMOS ratio becomes about 36:18 or 2:1. This ability to shift the NMOS:PMOS ratio quite markedly can provide improvements in the propagation delay. Additionally, because the first PMOS transistor MPS1 and the second PMOS transistor MPS2 are only active when the input supply voltage is at or above the VCCI trigger, these PMOS transistors can be standard Vt transistors.

Figure 1A:
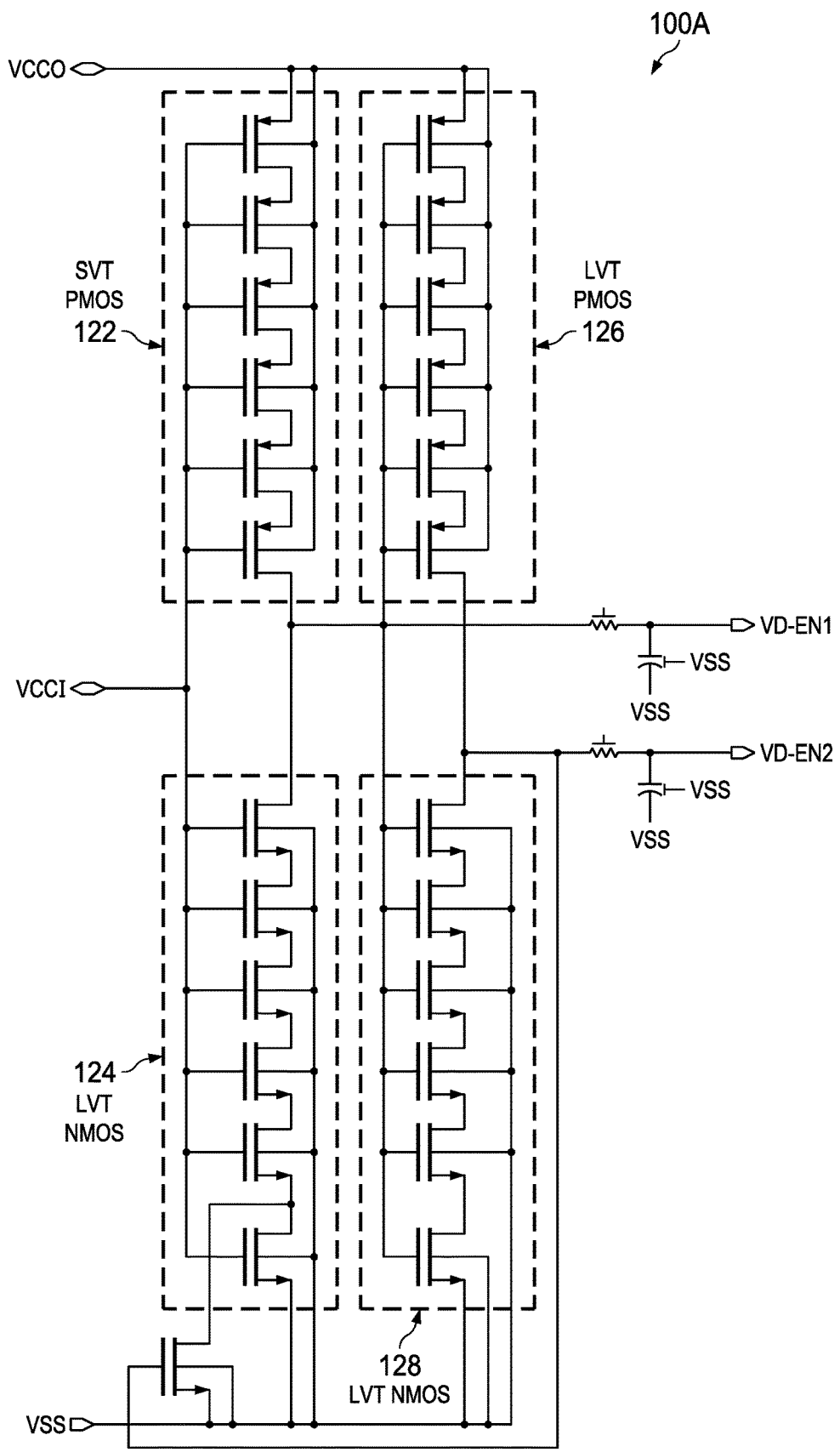
FIG. 1A depicts an example of a supply-difference sensing circuit used to control the relative sizes of the NMOS and PMOS transistors contributing to an output control signal in the level shifting circuit of FIG. 1 according to an embodiment of the disclosure.

The production of first voltage-difference-enable signal VD-EN1, which determines when the shift between the NMOS transistors being active and the PMOS transistors being active in second cross-coupled level shifter 104 will now be explained. FIG. 1A depicts an example of a supply difference sensing circuit 100A that can provide first voltage-difference-enable signal VD-EN1 to control which transistors in second cross-coupled level shifter 104 contribute to the output control signal S3T. In this embodiment, supply difference sensing circuit 100A is an inverter circuit that is composed of PMOS transistors having standard voltage thresholds, PMOS transistors having low voltage thresholds and NMOS transistors having low voltage thresholds. A first group of stacked PMOS transistors 122 that have standard voltage thresholds are coupled in series with a first group of stacked NMOS transistors 124 that have low voltage thresholds between the output supply voltage VCCO and the lower rail VSS. The gates of the first group of stacked PMOS transistors 122 and the gates of the first group of stacked NMOS transistors 124 each receive the input supply voltage VCCI. A point between the first group of stacked PMOS transistors 122 and the first plurality of stacked NMOS transistors 124 is coupled to provide the first voltage-difference-enable signal VD-EN1. A second group of stacked PMOS transistors 126 that have low voltage thresholds is also coupled in series with a second group of stacked NMOS transistors 128 that have low voltage thresholds between the output supply voltage and the lower rail. First voltage-difference-enable signal VD-EN1 is provided to the gates of the second group of stacked PMOS transistors 126 and the second group of stacked NMOS transistors 128, while a point between the second group of stacked PMOS transistors 126 and the second group of stacked NMOS transistors 128 is coupled to provide a second voltage-difference-enable signal VD-EN2.

An inverter circuit as commonly constructed, i.e., with all of the transistors having the same nominal threshold voltage, will switch between a low state and a high state at the midpoint of the voltage difference between the two rails. In FIG. 1A, by using standard Vt PMOS transistors and low Vt NMOS transistors in the first inverter, the transition between a low state and a high state is shifted to provide a VCCI trigger Vtrigger that can be used to determine which type of transistors in second cross-coupled level shifter 104 are enabled. The VCCI trigger Vtrigger is based on the following equations:

$$Vtrigger = \frac{Vdd + \sqrt{\frac{\beta n}{\beta p}} * Vtn + Vtp}{\left(1 + \sqrt{\frac{\beta n}{\beta p}}\right)} \quad \text{Equation 1}$$

where Vdd is the output supply voltage VCCO used in level shifting circuit 100, Vtrigger is the VCCI voltage at which the second cross-coupled level shifter 104 is shifted between enabling the NMOS transistors and enabling the PMOS transistors, Vtn and Vtp are the threshold voltages of the low Vt NMOS transistors and the standard Vt PMOS transistors respectively, and The beta of the P-type transistors ($\beta p$) and the beta of the N-type transistors ($\beta n$) are defined by the equations:

$$\beta n = \mu n Cox \frac{Wn}{Ln} \text{ and} \quad \text{Equation 2}$$

$$\beta p = \mu p Cox \frac{Wp}{Lp} \quad \text{Equation 3}$$

where $\mu n$ and $\mu p$ are the mobility of the NMOS and PMOS dopants respectively, Cox is the capacitance of the gate oxides, Wn and Wp are the widths of the respective N-type and P-type transistors, and Ln and Lp are the lengths of the respective N-type and P-type transistors.

Figure 1B:
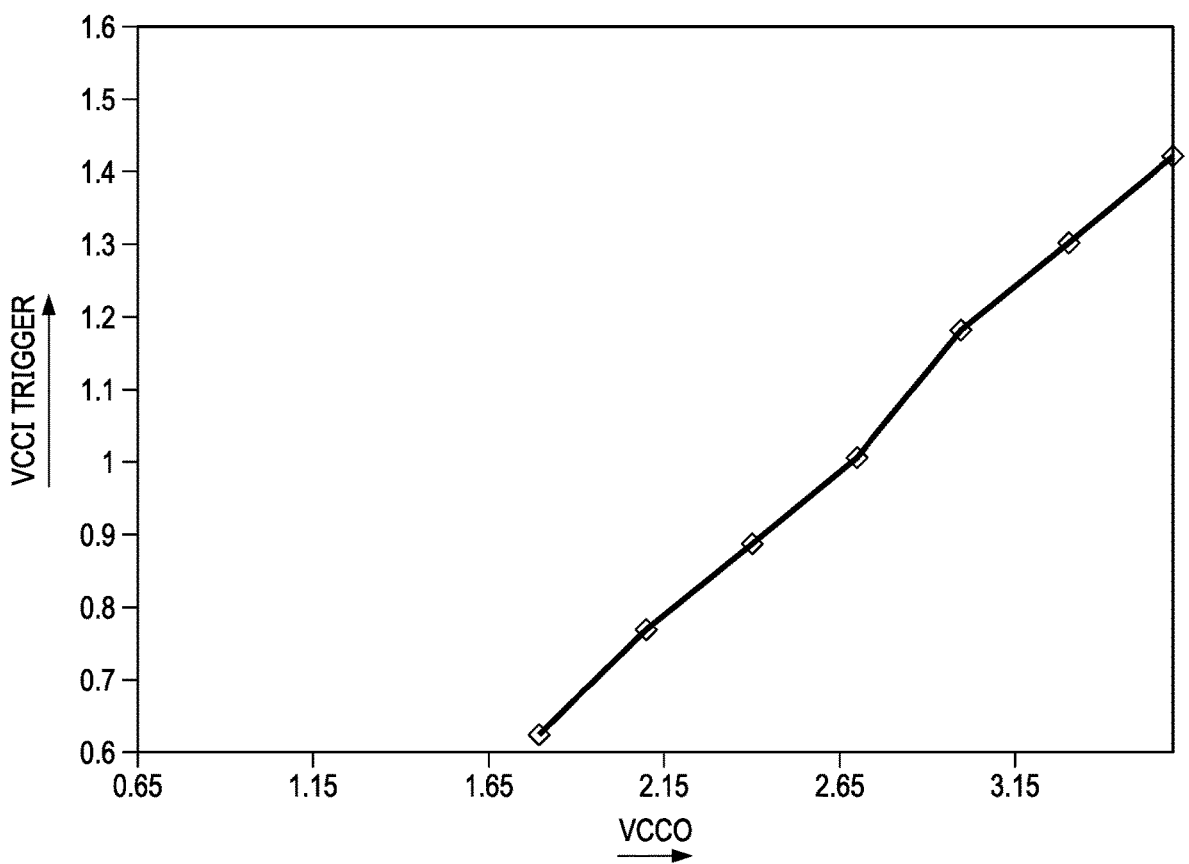
FIG. 1B depicts a graph of the relationship between an output supply voltage and a triggering voltage of an input supply voltage according to an embodiment of the disclosure.

FIG. 1B depicts a graph 100B that illustrates the correspondence between the output supply voltage VCCO and the corresponding VCCI trigger Vtrigger, while Table 1 below provides specific value of output supply voltage VCCO and the corresponding VCCI trigger Vtrigger:

TABLE 1

| VCCO (V) | VCCI trigger (V) |
|---|---|
| 3.6 | 1.417 |
| 3.3 | 1.3 |
| 3 | 1.18 |
| 2.7 | 1.004 |
| 2.4 | 0.886 |
| 2.1 | 0.768 |
| 1.8 | 0.624 |

For a given output supply voltage VCCO, when a corresponding input supply voltage VCCI is less than the VCCI trigger Vtrigger, then the NMOS transistors are enabled and when the input supply voltage VCCI is at or above the VCCI trigger Vtrigger, then the PMOS transistors are enabled. In this manner, the relative sizes of the PMOS and NMOS transistors can be shifted as the relationship between the input supply voltage VCCI and the output supply voltage VCCO changes.

FIG. 2A depicts graphs of the simulation of several signals from a level shifting circuit when the input supply voltage VCCI is 0.65 V and the output supply voltage VCCO is 3.6 V. Graph 200A illustrates second input control signal S2, while graph 200B illustrates two versions of the output control signal S3T. Old output control signal S3T-OLD is the signal provided using the voltage translator circuit 610 from FIG. 6 and new output control signal S3T-NEW is the signal provided using the level shifting circuit 100 of FIG. 1. It can be seen in this figure that new output control signal S3T-NEW both rises more quickly and falls more quickly than old output control signal S3T-OLD in response to changes in second input control signal S2, improving the propagation delay over the prior circuit by about 84 ns or eighty percent.

Figure 2B:
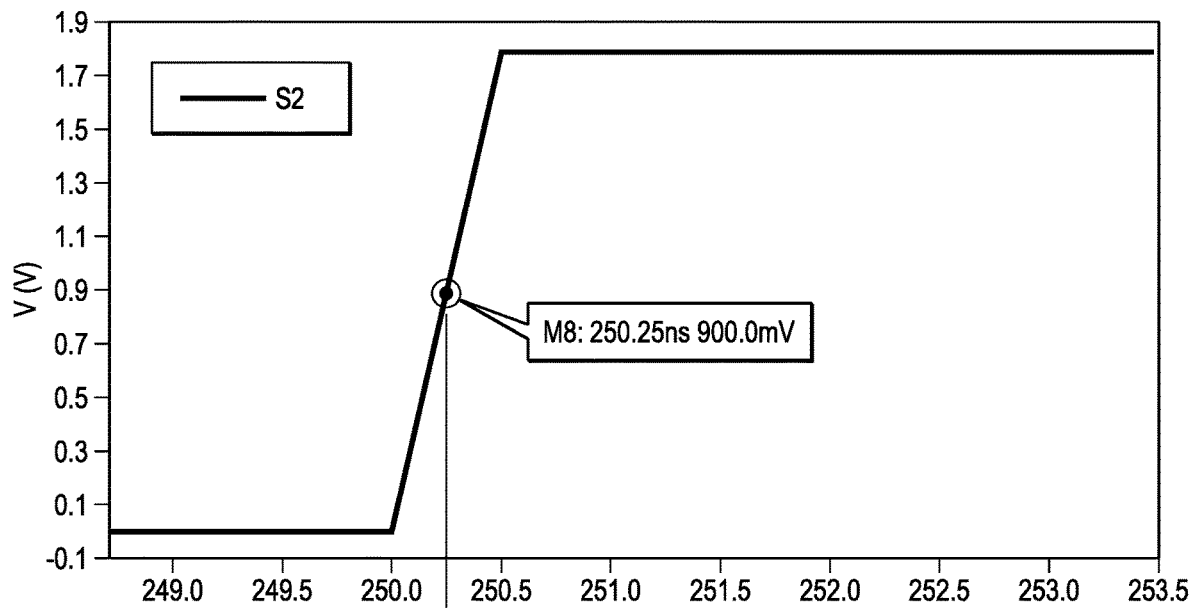
Figure 2B:
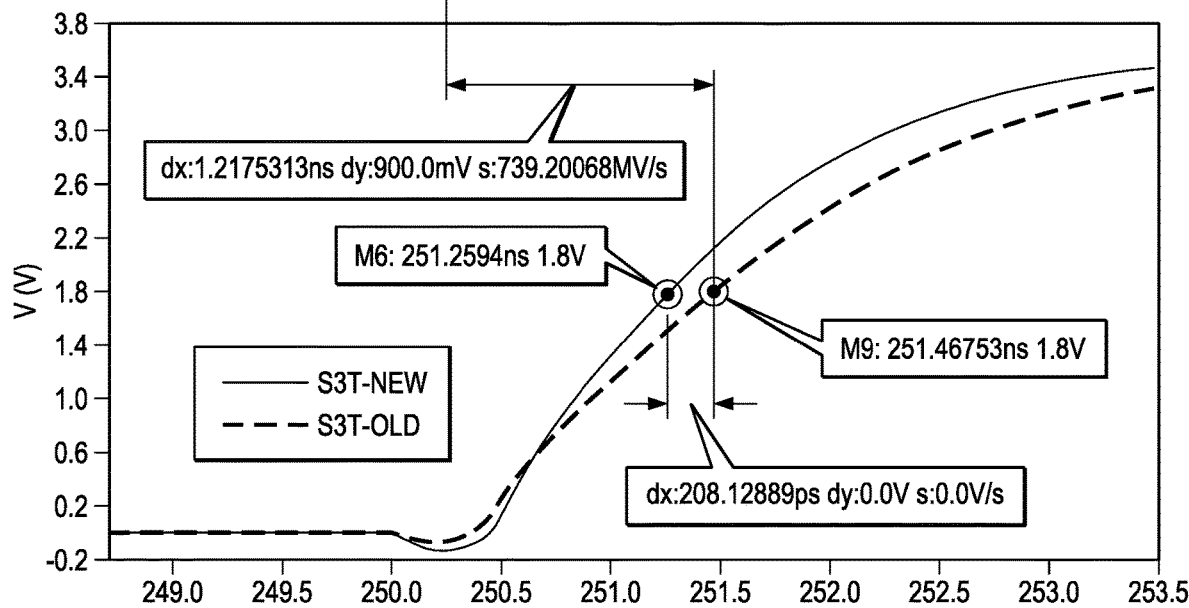

FIG. 2B depicts graphs of the simulation of several signals from a level shifting circuit when the input supply voltage VCCI is 1.8 V and the output supply voltage VCCO is 3.6 V. Graph 200C again illustrates second input control signal S2 and graph 200D again illustrates the old output control signal S3T-OLD from the voltage translator circuit 610 of FIG. 6 and the new output control signal S3T-NEW from level shifting circuit 100 of FIG. 1. Only the rising edge of the output control signals are shown in this figure; however, it is clear that new output control signal S3T-NEW rises more quickly than old output control signal S3T-OLD in response to a rise in second input control signal S2. The improvement in this embodiment is about 200 ps or about twenty percent.

Figure 3:
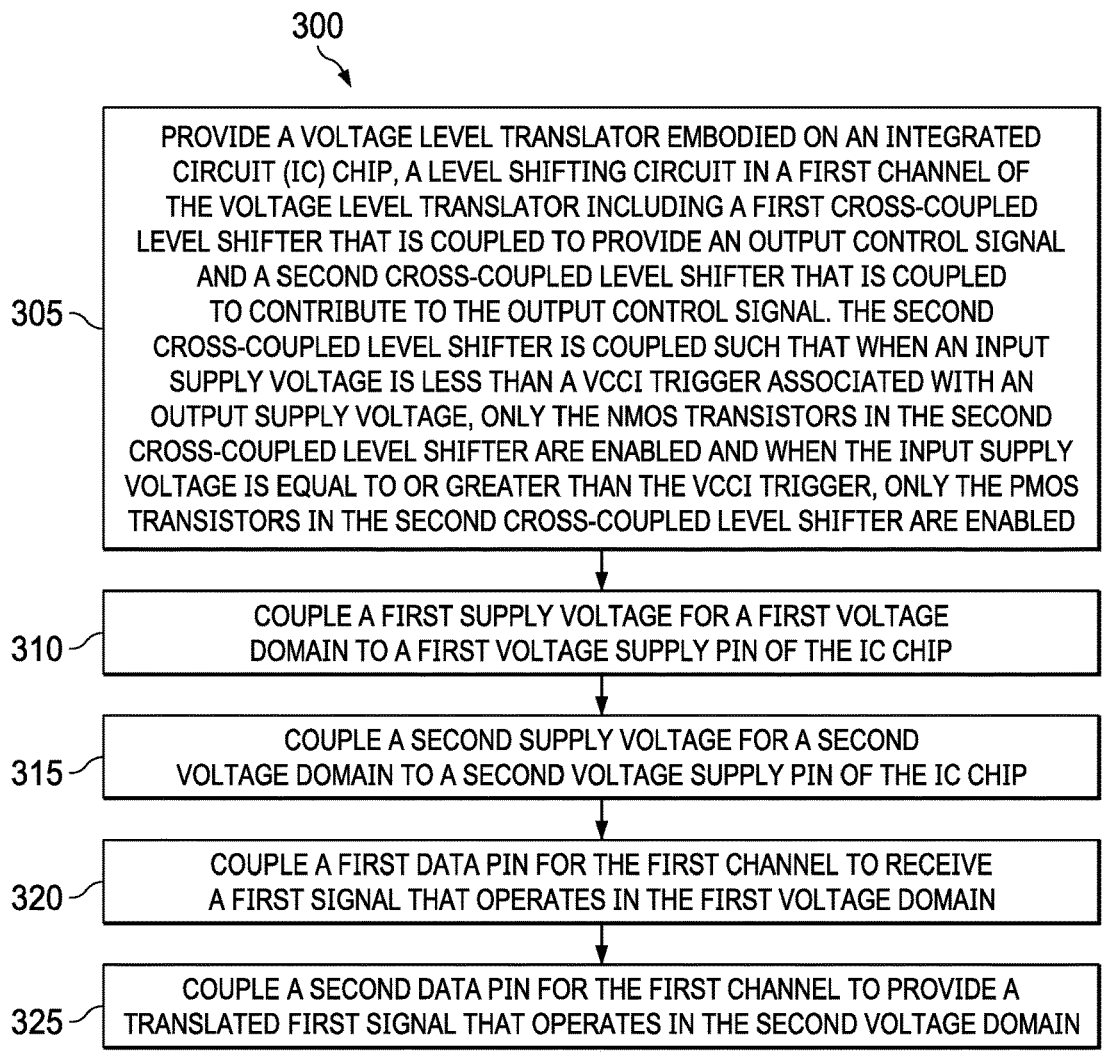
FIG. 3 depicts a method of operating a voltage level translator chip according to an embodiment of the disclosure.

FIG. 3 depicts a flowchart of a method 300 of operating a voltage level translator chip according to an embodiment of the disclosure. Method 300 begins with providing 305 a voltage level translator embodied on an integrated circuit (IC) chip. A level shifting circuit in a first channel of the voltage level translator includes a first cross-coupled level shifter that is coupled to provide an output control signal and a second cross-coupled level shifter that is coupled to contribute to the output control signal. The second cross-coupled level shifter is coupled such that when an input supply voltage is less than a VCCI trigger associated with an output supply voltage, only the NMOS transistors in the second cross-coupled level shifter are enabled and when the input supply voltage is equal to or greater than the VCCI trigger, only the PMOS transistors in the second cross-coupled level shifter are enabled, thereby effectively changing the relationship between the sizes of the PMOS and NMOS transistors.

Method 300 also includes coupling 310 a first supply voltage for a first voltage domain to a first voltage supply pin of the IC chip; coupling 315 a second supply voltage for a second voltage domain to a second voltage supply pin of the IC chip; coupling 320 a first data pin for the first channel to receive a first signal that operates in the first voltage domain; and coupling 325 a second data pin for the first channel to provide a translated first signal that operates in the second voltage domain.

Applicants have disclosed modifications to a level shifting circuit for a voltage translator that operates across a wide range of voltages. The level shifting circuit includes a first cross-coupled level shifter that provides an output control signal and a second cross-coupled level shifter that contributes to the output control signal. A supply difference sensing circuit is utilized to sense the difference between the input supply voltage and the output supply voltage and to create a first voltage difference-enable signal that has a binary value. When the first voltage difference-enable signal is low, only PMOS transistors in the second cross-coupled level shifter are enabled, i.e., can contribute to the output control signal, and when the first voltage difference-enable signal is high, only NMOS transistors in the second cross-coupled level shifter are enabled, thereby changing the effective sizes of the PMOS and NMOS transistors that provide the output control signal and improving the propagation delay. Although examples of specific configurations of the two cross-coupled level shifters and specific transistor sizes within the two cross-coupled level shifters are provided, the modifications can be applied in many different configurations.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A level shifting circuit for a voltage level translator, the level shifting circuit comprising:
    an output voltage input, a lower rail, a first control input, a second control input, and an input voltage input;
    first cross-coupled level shifter circuitry coupled between the output voltage input and the lower rail and coupled to the first control input and the second control input, and having a control output;
    second cross-coupled level shifter circuitry coupled between the output voltage input and the lower rail and coupled to the first control input and the second control input, and having a first node coupled to the control output, the second cross-coupled level shifter circuitry including a first P-type metal oxide silicon (PMOS) transistor coupled in series with a first N-type metal oxide silicon (NMOS) transistor between the output supply voltage and the first node and a second PMOS transistor coupled in series with a second NMOS transistor between the output supply voltage and the first node; and
    sensing circuitry coupled to the output voltage input, the input voltage input, and the lower rail, and having a difference enable output couple to the second cross-coupled level shifter circuitry.

2. The level shifting circuit as recited in claim 1 in which the second cross-coupled level shifter circuitry includes:
    a third PMOS transistor coupled between the output voltage input and the first PMOS transistor;
    a fourth PMOS transistor coupled between the output voltage input and the second PMOS transistor, the third PMOS transistor and the fourth PMOS transistor having gates coupled to the difference enable output; and
    a third NMOS transistor coupled between the first node and the lower rail, a gate of the third NMOS transistor being coupled to the difference enable output.

3. The level shifting circuit as recited in claim 2 in which a gate of the first PMOS transistor is coupled to a second node between the second PMOS transistor and the second NMOS transistor, a gate of the second PMOS transistor is coupled to a third node between the first PMOS transistor and the first NMOS transistor, a gate of the second NMOS transistor is coupled to receive the first control input and a gate of the first NMOS transistor is coupled to receive the second control input.

4. The level shifting circuit as recited in claim 3 in which the second cross-coupled level shifter circuitry includes:
    a fifth PMOS transistor coupled between the output supply voltage and the third PMOS transistor; and
    a sixth PMOS transistor coupled between the output supply voltage and the fourth PMOS transistor, the fifth PMOS transistor and the sixth PMOS transistor having gates coupled to a first circuit-enable input; and
    a fourth NMOS transistor coupled between the third NMOS transistor and the lower rail and having a gate coupled to a second circuit-enable input.

5. The level shifting circuit as recited in claim 4 wherein the first cross-coupled level shifter circuitry includes:
    a seventh PMOS transistor coupled in series with a fifth NMOS transistor between the output voltage input and a fourth node;
    an eighth PMOS transistor coupled in series with a sixth NMOS transistor between the output voltage input and the fourth node, a respective gate of the fifth NMOS transistor being coupled to the second control input, a respective gate of the sixth NMOS transistor being coupled to receive the first input control signal, a respective gate of the seventh PMOS transistor being coupled to a fifth node between the eighth PMOS transistor and the sixth NMOS transistor, a respective gate of the eighth PMOS transistor being coupled to a sixth node between the seventh PMOS transistor and the fifth NMOS transistor;
    a seventh NMOS transistor and an eighth NMOS transistor coupled in parallel between the output voltage input and the sixth node; and
    a ninth NMOS transistor and a tenth NMOS transistor coupled in parallel between the output voltage input and the fifth node;
    the fourth node being coupled to the lower rail through the fourth NMOS transistor.

6. The level shifting circuit as recited in claim 5 in which each of the first PMOS transistor through the sixth PMOS transistor has a standard voltage threshold, each of the seventh PMOS transistor and the eighth PMOS transistor has a low voltage threshold, each of the first NMOS transistor through the sixth NMOS transistor, the eighth NMOS transistor and the ninth NMOS transistor has a low voltage threshold and each of the seventh NMOS transistor and the tenth NMOS transistor has a standard voltage threshold.

7. A voltage level translator integrated circuit having a first input in a first voltage domain and a first output in a second voltage domain, the first and second voltage domains spanning a range of voltages, the voltage level translator integrated circuit comprising:
    an input buffer having the first input and having a first control output and a second control output, the input buffer operating in the first voltage domain;
    a level shifting circuit coupled to the first control output and the second control output and having a shifted control output;

a gate control circuit coupled to the first control input, the second control input and the shifted control output and having a first gate control output and a second gate control output;

an output buffer coupled to the first gate control output and the second gate control output and having the first output, the level shifting circuit, the gate control circuit and the output buffer operating in the second voltage domain;

a first cross-coupled level shifter circuit coupled between an output voltage input and a lower rail and coupled to the first control output and the second control output and having the shifted control output;

a second cross-coupled level shifter circuit coupled between the output voltage input and the lower rail, and coupled to the first control output and the second control output, and coupled to the shifted control output, the second cross-coupled level shifter including a first P-type metal oxide silicon (PMOS) transistor coupled in series with a first N-type metal oxide silicon (NMOS) transistor and a second PMOS transistor coupled in series with a second NMOS transistor; and sensing circuit coupled to the output voltage input, the input voltage input, and the lower rail, and having a difference enable output coupled to the second cross-coupled level shifter circuitry.

8. The voltage level translator integrated circuit as recited in claim 7 in which the sensing circuit includes:
   a first group of stacked PMOS transistors coupled in series between the output voltage input and a first voltage-difference-enable output, each of the first group of stacked PMOS transistors having a standard voltage threshold (Vt);
   a first group of stacked NMOS transistors coupled in series between the first voltage-difference-enable output and the lower rail, each of the first group of stacked NMOS transistors having a low Vt, respective gates of the first group of stacked PMOS transistors and the first group of stacked NMOS transistors being coupled to the input voltage input;
   a second group of stacked PMOS transistors coupled in series between the output voltage input and a second voltage-difference-enable output, each of the second group of stacked PMOS transistors having a low Vt; and
   a second group of stacked NMOS transistors coupled in series between the second voltage-difference-enable output and the lower rail, each of the second group of stacked NMOS transistors having a low Vt, respective gates of the second group of stacked PMOS transistors and of the second group of stacked NMOS transistors being coupled to the first voltage-difference-enable output.

9. The voltage level translator integrated circuit as recited in claim 7 in which the second cross-coupled level shifter includes:
   a third PMOS transistor and a fourth PMOS transistor, each having a respective gate coupled to the first voltage-difference-enable output;
   a fifth PMOS transistor and a sixth PMOS transistor each have a respective gate coupled to a first circuit-enable output;
   a third NMOS transistor having a gate coupled to the first voltage-difference-enable output; and
   a fourth NMOS transistor coupled between the third NMOS transistor and the lower rail and having a gate coupled to receive a second circuit-enable output.

10. The voltage level translator integrated circuit as recited in claim 9 in which the fifth PMOS transistor and the third PMOS transistor are coupled in series between the output voltage input and the first PMOS transistor, the sixth PMOS transistor and the fourth PMOS transistor are coupled in series between the output voltage input and the second PMOS transistor, and the third NMOS transistor and the fourth NMOS transistor are coupled in series between the first node and the lower rail.

11. The voltage level translator integrated circuit as recited in claim 10 in which the first cross-coupled level shifter includes:
   a seventh PMOS transistor coupled in series with a fifth NMOS transistor between the output voltage input and a fourth node;
   an eighth PMOS transistor coupled in series with a sixth NMOS transistor between the output voltage input and the fourth node, a respective gate of the fifth NMOS transistor being coupled to receive the second control input, a respective gate of the sixth NMOS transistor being coupled to receive the first control signal input, a respective gate of the seventh PMOS transistor being coupled to a fifth node between the eighth PMOS transistor and the sixth NMOS transistor, a respective gate of the eighth PMOS transistor being coupled to a sixth node between the seventh PMOS transistor and the fifth NMOS transistor;
   a seventh NMOS transistor and an eighth NMOS transistor coupled in parallel between the output voltage input and the sixth node;
   a ninth NMOS transistor and a tenth NMOS transistor coupled in parallel between the output control input and the fifth node; and
   the fourth node is coupled to the lower rail through the fourth NMOS transistor.

12. The voltage level translator integrated circuit as recited in claim 11 in which each of the input supply voltage and the output supply voltage can be between 0.65 V and 3.6 V.

13. A process of operating level shifter circuitry comprising:
   (a) sensing an output voltage and an input voltage;
   (b) producing a first difference enable signal when the input voltage is less than a trigger voltage of the output voltage;
   (c) producing a second difference enable signal when the input supply voltage is equal to or greater than the trigger voltage;
   (d) coupling only a first set of transistors in second cross-coupled level shifter circuitry to a control output signal in first cross-coupled level shifter circuitry in response to the first difference enable signal; and
   (e) coupling only a second set of transistors in the second cross-coupled level shifter circuitry to the control output signal in response to the second difference enable signal.

14. The process of claim 13 including coupling only a first set of P-type metal oxide silicon (PMOS) transistors to the control output signal.

15. The process of claim 13 including coupling only a second set of N-type metal oxide silicon (NMOS) transistors to the control output signal.

* * * * *